United States Patent
Bridger et al.

(10) Patent No.: US 9,000,486 B2
(45) Date of Patent: Apr. 7, 2015

(54) III-NITRIDE HETEROJUNCTION DEVICE

(71) Applicant: International Rectifier Corporation, El Segundo, CA (US)

(72) Inventors: Paul Bridger, Altadena, CA (US); Robert Beach, Altadena, CA (US)

(73) Assignee: International Rectifier Corporation, El Segundo, CA (US)

( * ) Notice: Subject to any disclaimer, the term of this patent is extended or adjusted under 35 U.S.C. 154(b) by 128 days.

(21) Appl. No.: 13/906,294

(22) Filed: May 30, 2013

(65) Prior Publication Data

US 2013/0256695 A1    Oct. 3, 2013

Related U.S. Application Data

(63) Continuation of application No. 12/154,341, filed on May 22, 2008, now Pat. No. 8,455,920.

(60) Provisional application No. 60/931,339, filed on May 23, 2007.

(51) Int. Cl.
| | |
|---|---|
| H01L 29/66 | (2006.01) |
| H01L 29/205 | (2006.01) |
| H01L 29/06 | (2006.01) |
| H01L 29/10 | (2006.01) |
| H01L 29/778 | (2006.01) |
| H01L 29/20 | (2006.01) |

(52) U.S. Cl.
CPC .......... *H01L 29/205* (2013.01); *H01L 29/0692* (2013.01); *H01L 29/1029* (2013.01); *H01L 29/7787* (2013.01); *H01L 29/778* (2013.01); *H01L 29/2003* (2013.01)

(58) Field of Classification Search
CPC .............. H01L 29/7786; H01L 29/205; H01L 29/66462; H01L 29/778; H01L 29/0692; H01L 29/1029; H01L 29/7787; H01L 29/2003
USPC ............ 257/94, 183, 194, 199, 200, E29.246, 257/E29.247, E29.248, E29.252, E21.403, 257/E21.407
See application file for complete search history.

(56) References Cited

U.S. PATENT DOCUMENTS

| | | | |
|---|---|---|---|
| 7,408,208 B2 | 8/2008 | Herman | |
| 7,777,254 B2 * | 8/2010 | Sato | ............... 257/194 |
| 2005/0189561 A1 | 9/2005 | Kinzer | |
| 2006/0057790 A1 | 3/2006 | Clarke | |
| 2006/0060871 A1 * | 3/2006 | Beach | ............. 257/94 |
| 2006/0065912 A1 | 3/2006 | Beach | |
| 2008/0303064 A1 * | 12/2008 | Sato | ............. 257/194 |
| 2009/0072273 A1 * | 3/2009 | Briere | ............. 257/194 |
| 2009/0078964 A1 * | 3/2009 | Briere | ............. 257/192 |

* cited by examiner

*Primary Examiner* — Cuong Q Nguyen
*Assistant Examiner* — Yosef Gebreyesus
(74) *Attorney, Agent, or Firm* — Farjami & Farjami LLP

(57) ABSTRACT

A III-nitride heterojunction semiconductor device having a III-nitride heterojunction that includes a discontinuous two-dimensional electron gas under a gate thereof.

18 Claims, 4 Drawing Sheets

III-NITRIDE HETEROJUNCTION DEVICE

This is a continuation of application Ser. No. 12/154,341 filed May 22, 2008.

RELATED APPLICATION

This application is based on and claims priority to U.S. Provisional Application Ser. No. 60/931,339, filed on May 23, 2007, entitled Apertured Gate Channel for Gate Charge and RQ Reduction, to which a claim of priority is hereby made and the disclosure of which is incorporated by reference.

DEFINITION

III-nitride as used herein refers to a semiconductor alloy that includes nitrogen and a group III element such as Al, Ga, or In, including but not limited to AlN, GaN, AlGan, InGaN, InN, or InAlGaN.

BACKGROUND AND SUMMARY OF THE INVENTION

The present application relates to a semiconductor device.

The losses associated with switch mode power supplies depend on the resistance of the FETs used in the circuit as well as the charge utilized by the driver during the switching event. At higher frequencies, the losses associated with charge, $Q_g$, $Q_{gd}$, etc., become large, while at high currents, the losses associated with resistance becomes large. The resistance of a device decreases with larger device width and smaller pitch (because of reduced channel and contact resistance), while the switching charge increases, which leads to a trade off between resistive and switching losses. When deciding on optimal device size, performance is generally evaluated by the R*Q product of a device. There are a few strategies for changing the RQ product. One strategy is to change the density of the two-dimensional gas (2-DEG) over the entire wafer during the formation of the III-nitride heterojunction, which leads to a penalty in drift resistance and associated RA product. Another approach is to change the 2-DEG charge in the entire region under the gate during device fabrication. Reducing the charge under the gate lowers the threshold voltage and capacitance. There are a number of ways to reduce the charge under the gate including, recess etching of the gate region, shallow implantation, and using p-type gate materials. The current processes, such as gate recessing, are difficult to control. A standard etching tool will have 10-20% variation across a wafer, which leads to a similar variation in threshold voltage across the wafer.

The invention disclosed here addresses a fundamental limitation to power management in the switch mode power supplies. Specifically, according to an aspect of the present invention, the gate charge is charged without changing the device gate width. More specifically, in a device according to the present invention, instead of reducing the charge under the gate to reduce the gate charge, the gate area is reduced by interrupting conduction under the gate which will reduce both the gate capacitance and conductivity with a smaller impact on resistance since the total ohmic contact area has not been affected. Furthermore, in a device according to the present invention, the size and the density of the ohmic contacts do not need to be adjusted as would be required when there is a blanket reduction of charge in the channel. Moreover, there will be no change in the threshold voltage of the device as may be the case when the charge is reduced in the entire region under the gate. Threshold voltage will not change since the charge density under the unaffected gate area has remained the same. Thus, the threshold voltage, gate charge, and device resistance can be tuned independently.

Advantageously, a process for fabricating a device according to the present invention will be easier compared to processes that require blanket gate charge density reduction. Moreover, the approach disclosed herein is dramatically reduces process influence on device characteristics.

Other features and advantages of the present invention will become apparent from the following description of the invention which refers to the accompanying drawings.

DETAILED DESCRIPTION OF EMBODIMENTS OF THE INVENTION

Figure 1A:
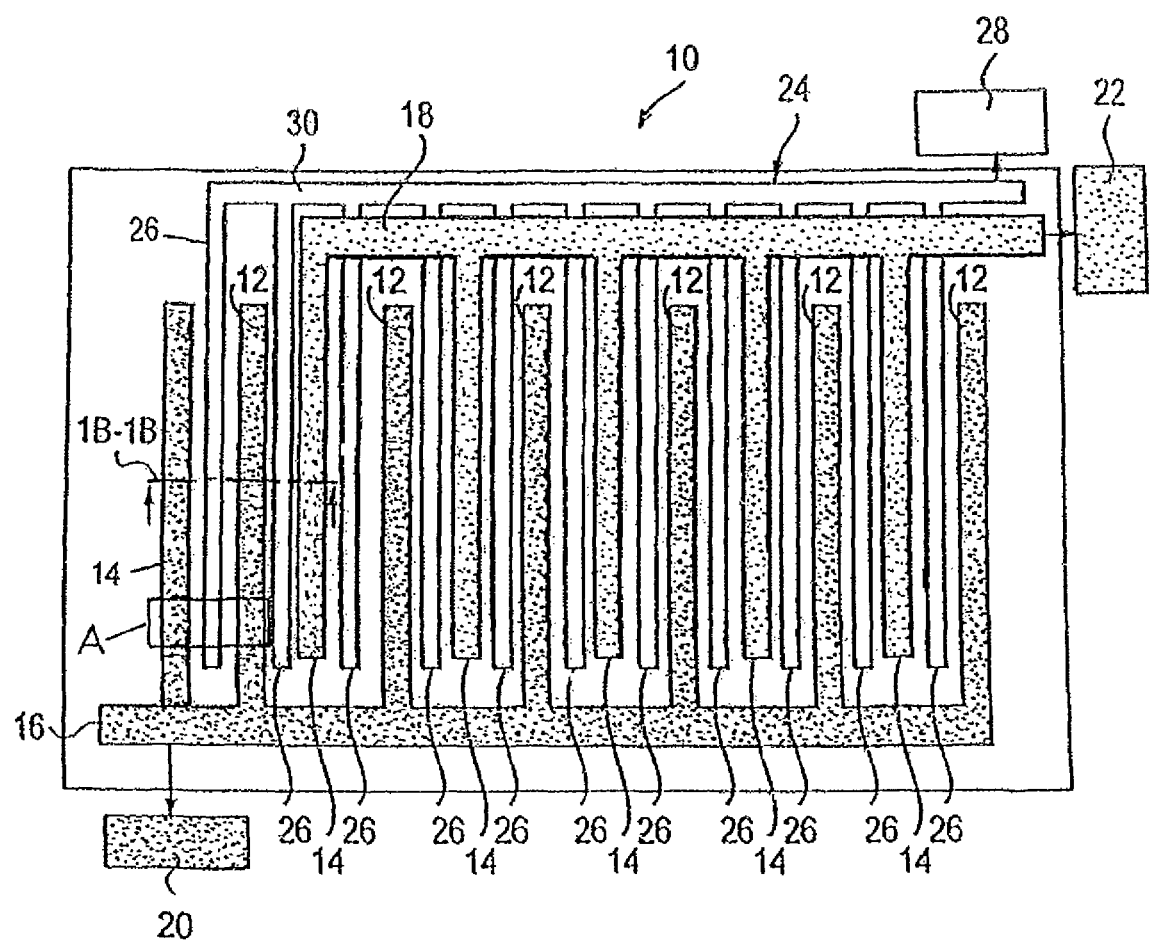
FIG. 1A schematically illustrates a top plan view of an active cell of a power semiconductor device according to the first embodiment of the present invention.
Figure 1B:
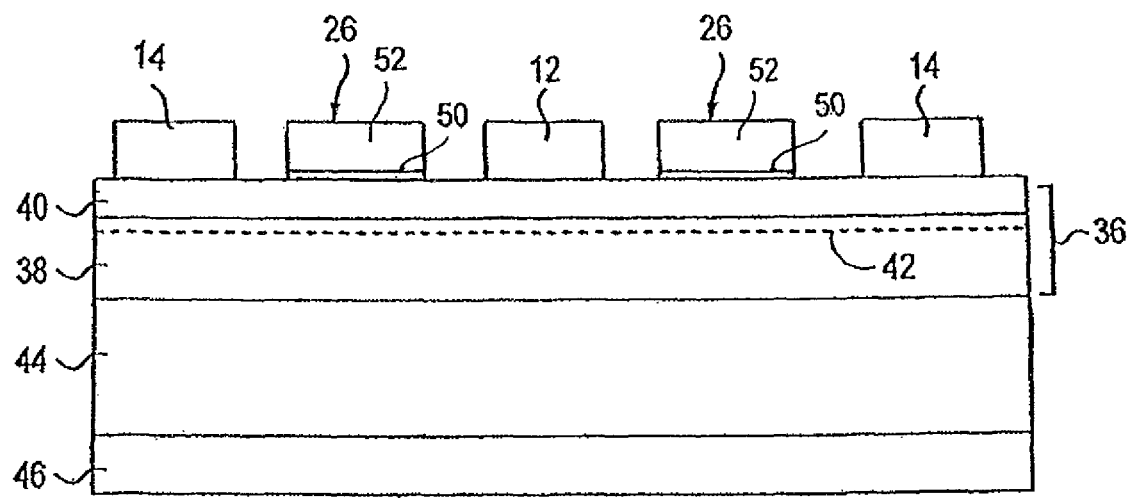
FIG. 1B schematically illustrates a cross-sectional view of the device of FIG. 1A along line 1B-1B viewed in the direction of the arrows.

Referring to FIGS. 1A-1B, a power semiconductor device according to the first embodiment of the present invention is a III-nitride based metal, insulator heterojunction field effect transistor (MISHFET) 10, which includes a plurality of first power electrodes (drain electrodes) 12, and a plurality of second power electrodes (source electrodes) 14 arranged in an interdigitated pattern. Drain electrodes 12 are electrically connected to one another by a respective drain feed 16 and source electrodes 14 are electrically connected to one another by a respective source feed 18. Drain feed 16 is also electrically connected to a first power pad (drain pad) 20 and source feed 18 is electrically connected to a second power pad (source pad) 22. Drain pad 20 and source pad 22 are located somewhere on the die and are used for external power connection.

Device 10 according to the first embodiment further includes a gate structure 24. Gate structure 24 includes a plurality of gate fingers 26 each disposed between a respective drain electrode 12 and source electrode 14. Gate fingers 26 are preferably electrically connected to one another and to gate pad 28 by a common gate feed 30.

Referring specifically to FIG. 1B, a device 10 according to the first embodiment of the present invention includes a III-nitride heterojunction region 36. III-nitride heterojunction region 36 includes first III-nitride semiconductor body 38 and second III-nitride semiconductor body 40 formed over first III-nitride semiconductor body 38. First III-nitride semiconductor body 38 and second III-nitride body 40 have different band gaps, may have different in-plane lattice constants, and are selected so that the heterojunction of the two bodies results in a two-dimensional electron gas (2-DEG) $42$ as is well known in the art.

Heterojunction $36$ is preferably formed over buffer layer $44$ which is formed over substrate $46$. Each drain electrode $12$, and each source electrode $14$ is electrically coupled to heterojunction $36$ and 2-DEG $42$. For example, each electrode $12$, $14$ is ohmically connected to second III-nitride semiconductor body $40$.

Figure 1C:
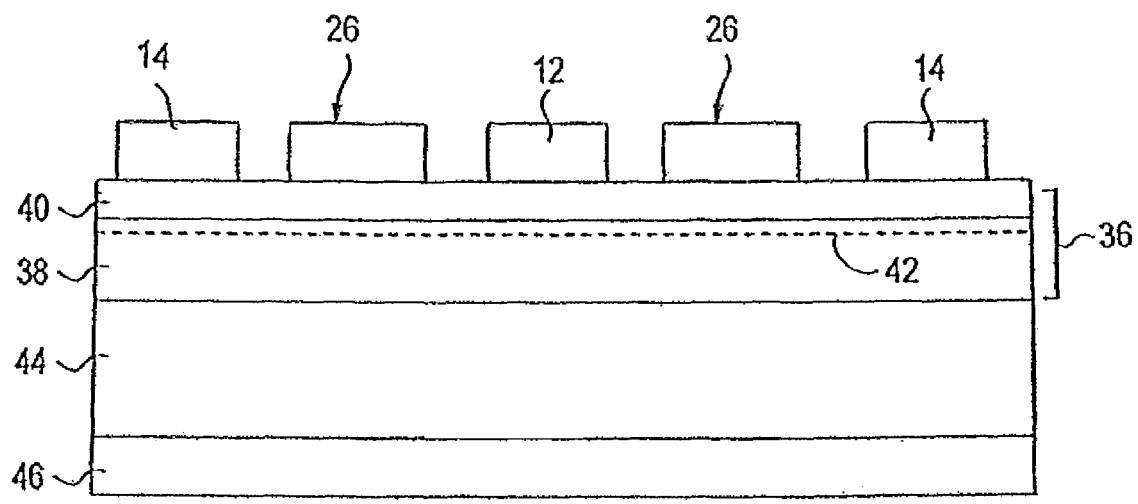
FIG. 1C illustrates an alternative embodiment viewed along line 1B-1B in the direction of the arrows.

In a preferred embodiment of the present invention, each gate finger $26$ includes a gate insulation $50$, and a gate electrode $52$ disposed over gate insulation $50$. Alternatively, gate fingers $26$ may make schottky contact with second III-nitride semiconductor body $40$ thereby forming a heterojunction field effect transistor without deviating from the scope and the spirit of the present invention. For example, each gate finger $26$ may make schottky contact with second III-nitride body $40$ as illustrated by FIG. 1C.

Figure 2A:
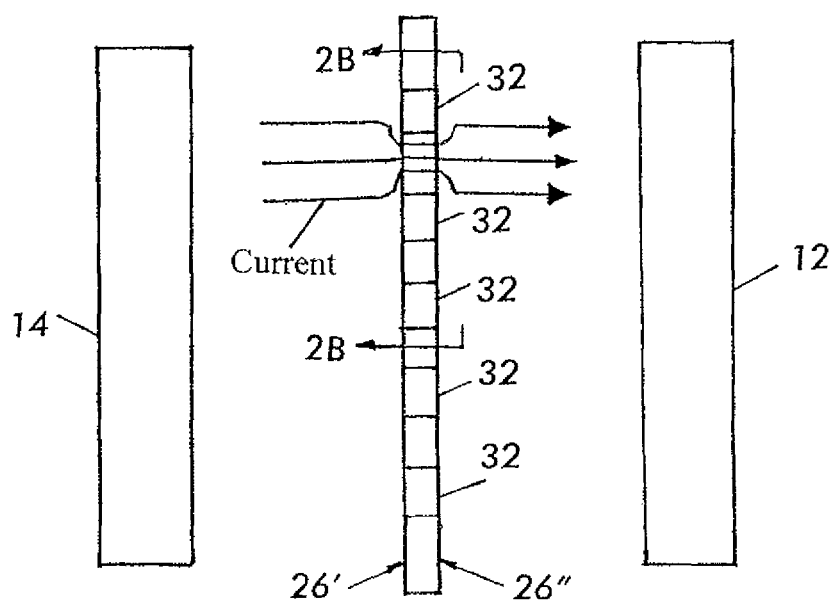
FIG. 2A illustrates an enlarged portion A from FIG. 1A.
Figure 2B:
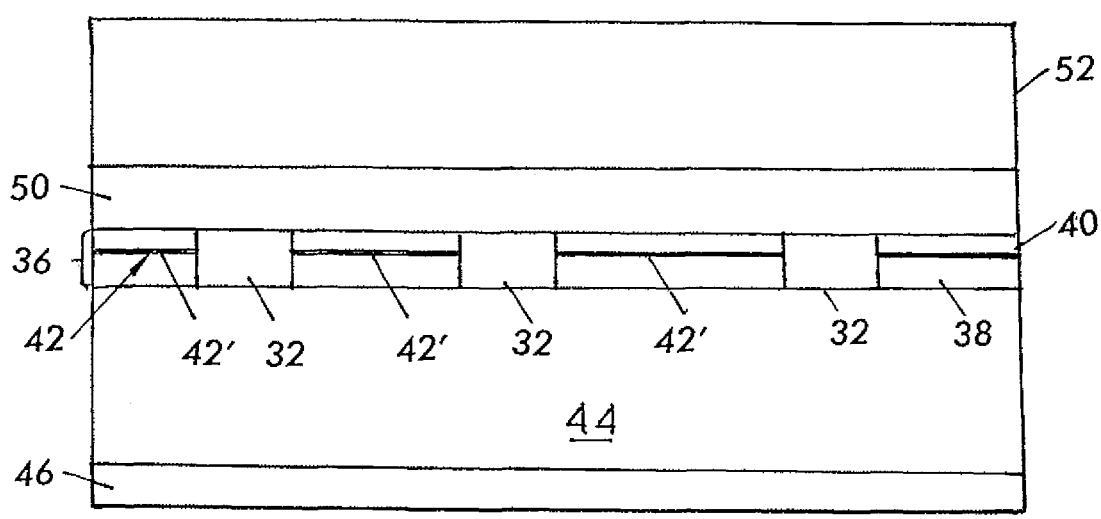
FIG. 2B illustrates a sectional view along line 2B-2B viewed in the direction of the arrows.

Referring to FIGS. 2A and 2B, in which like numerals identify like features, according to one aspect of the present invention, 2-DEG $42$ below gate finger $26$ of a device according to the present invention is periodically interrupted and thus includes a plurality of spaced interrupted regions $32$. Consequently, as illustrated by FIG. 2B, 2-DEG $42$ under each gate finger $26$ is segmented by interrupted regions $32$ whereby 2-DEG $42$ under each gate finger $26$ becomes a plurality of spaced 2-DEG regions $42'$.

Thus, in a device according to the present invention, current passes through the spaces between interrupted regions $32$, while the remainder of the area between electrodes $12$, $14$ is available for conduction, whereby the advantages outlined above are attained.

In the preferred embodiment, first and second power electrodes $12$, $14$ and gate fingers $26$ disposed therebetween are elongated bodies, and spaced interrupted regions $32$ are disposed along the length of each gate finger $26$. Moreover, at least one of the interrupted regions $32$ is laterally bound within (i.e. does not extend beyond) lateral sides $26'$, $26''$ of an overlying gate finger $26$.

Figures 3A, 3B, 3C:
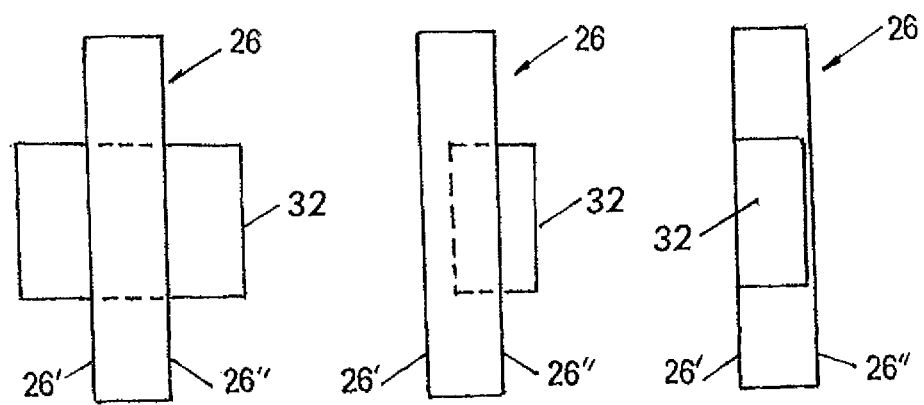
FIG. 3A illustrates an arrangement according to the second embodiment of the present invention.
FIG. 3B illustrates an arrangement according to the third embodiment of the present invention.
FIG. 3C illustrates an arrangement according to the fourth embodiment of the present invention.

Referring now to FIG. 3A, in a second embodiment of the present invention, at least one of the interrupted regions $32$ may be wider than the width of and overlying gate finger $26$. Thus, as illustrated by FIG. 3A, an interrupted region $32$ can extend laterally beyond the lateral sides $26'$, $26''$ of a gate finger $26$ that is disposed over the interrupted region $32$.

Referring to FIG. 3B, in a third embodiment, an interrupted region $32$ may extend only partially under a respective gate finger $26$, while extending laterally beyond one of the lateral sides (e.g. side $26''$) of the overlying gate finger $26$.

Referring to FIG. 3C, in a fourth embodiment of the present invention, an interrupted region $32$ may extend only partially under a gate finger $26$, but does not laterally extend beyond a lateral side (e.g. side $26'$) of the overlying gate finger $26$.

Figure 4A:
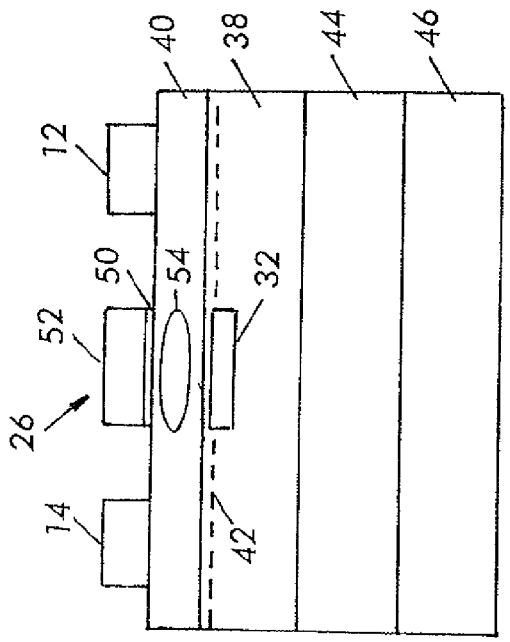
FIGS. 4A-4D illustrate alternative embodiments of a device according to the present invention.
Figure 4B:
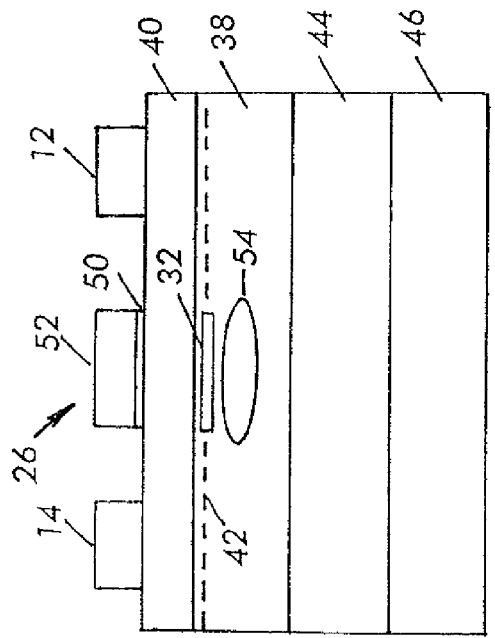
Figure 4C:
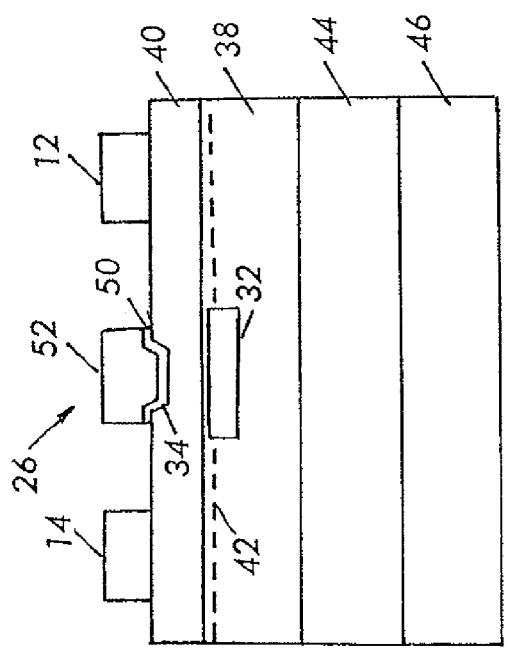
Figure 4D:
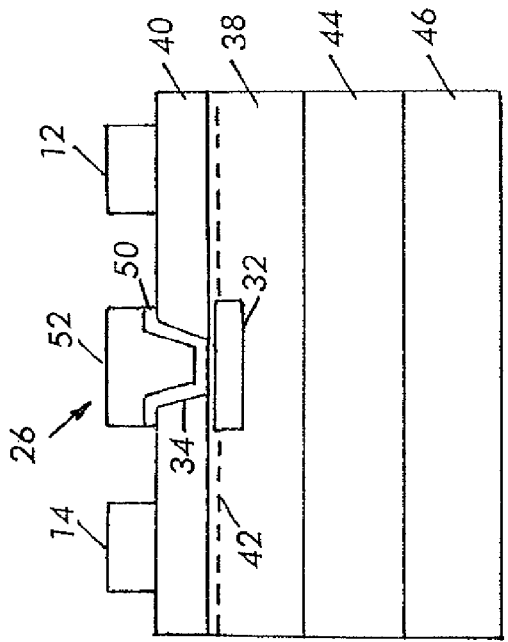

In any one of the embodiments disclosed herein, an interrupted region $32$ may be formed by a recess $34$ that partially extends through second III-nitride semiconductor body $40$ (FIG. 4A), or a recess $34$ that extends fully through second III-nitride semiconductor body $40$ (FIG. 4B) and reaching first III-nitride semiconductor body $38$. Alternatively, a suitable implant into first III-nitride body $38$ (FIG. 4D) or second III-nitride body $40$ (FIG. 4C) may be employed to obtain an implant region $54$ to cause the formation in an interrupted region $32$. A suitable implant may be an ion implant such as a fluorine ion implant or a chlorine ion implant, or a transition metal implant such as a Fe, or a Cr, or a V implant.

It should be noted that a device according to the present invention is not restricted to the embodiments disclosed herein. For example, the shape of interrupted regions $32$, implant dosage and dosage distribution in interrupted regions $32$, and overlap and position of the implanted regions $54$ can be adjusted as desired to, for example, obtain a suitable Qgs or Qgd value without deviating from the scope and spirit of the present invention.

Moreover, a device according to the present invention can be fabricated through using any suitable process. To obtain a device according to the present invention, interrupted regions $32$ can be formed during the step designed for isolating the individual die in a wafer. For example, recesses $34$ may be formed in each die during the same step recesses are formed for isolation purposes. Alternatively, implant regions $54$ may be formed to obtain interrupted regions $32$ in the same step that is carried out to obtain isolation between individual die in a wafer. The latter may advantageously reduce surface topography.

In a device according to the present invention, first III-nitride semiconductor body $38$ may be composed of GaN, second III-nitride semiconductor body $40$ may be composed AlGaN, and buffer layer $44$ may be composed of AlN. In addition, drain electrodes $12$, and source electrodes $14$ may be composed of any suitable material such a Ti/Al, Ni/Au, Hf, Si, or another Si containing alloy. A suitable material for gate insulation $50$ may be $SiO_2$, $Si_3N_4$, or diamond and a suitable material for gate electrode $52$ may be Ti/Al, Ni/Au, Hf, Si, or a Si containing alloy.

Furthermore, substrate $46$ is preferably made from Si. However, other substrate materials such as SiC, or sapphire may be used. It should be noted that buffer layer $8$ may be omitted if substrate $46$ is composed of a material compatible with first III-nitride semiconductor body $38$. For example, substrate $46$ may be formed from bulk GaN.

Also, it should be noted that although the preferred embodiments include interdigitated power electrodes, other layouts are also possible for lateral devices. For example, the power electrodes may be arranged in cellular or checkerboard patterns without deviating from the scope and spirit of the present invention.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A III-nitride device comprising:
  a III-nitride heterojunction that includes a first III-nitride semiconductor body having one band gap, and a second III-nitride semiconductor body having another band gap disposed on said first III-nitride semiconductor body to generate a two dimensional electron gas;
  a first power electrode disposed over said III-nitride heterojunction and electrically coupled to said two dimensional electron gas;
  a second power electrode disposed over said III-nitride heterojunction and electrically coupled to said two dimensional electron gas;
  a gate arrangement disposed between said first power electrode and said second power electrode;
  spaced interrupted regions in said two-dimensional electron gas below said gate arrangement, wherein at least one of said spaced interrupted regions extends only partially under said gate arrangement.

2. The III-nitride device of claim 1, wherein said first and second power electrodes are ohmically coupled to said second III-nitride semiconductor body.

3. The III-nitride device of claim 1, wherein said gate arrangement includes an electrode that is schottky coupled to said second III-nitride semiconductor body.

4. The III-nitride device of claim 1, wherein said gate arrangement includes a gate electrode and a gate insulation body interposed between said gate electrode and said III-nitride heterojunction.

5. The III-nitride device of claim 1, wherein said first power electrode, said second power electrode, and said gate arrangement are parallel elongated bodies.

6. The III-nitride device of claim 1, wherein said spaced interrupted regions are disposed along said gate arrangement.

7. The III-nitride device of claim 1, wherein said interrupted regions are disposed below respective recesses in said second III-nitride semiconductor body.

8. The III-nitride device of claim 1, wherein said interrupted regions comprise recesses formed in said III-nitride heterojunction.

9. The III-nitride device of claim 1, further comprising implant regions in said III-nitride heterojunction each said implant region causing the formation of at least one interrupted region.

10. The III-nitride device of claim 9, wherein said implant regions comprise a transition metal.

11. The III-nitride device of claim 10, wherein said transition metal comprises Fe.

12. The III-nitride device of claim 10, wherein said transition metal comprises Cr.

13. The III-nitride device of claim 10, wherein said transition metal comprises V.

14. The III-nitride device of claim 1, wherein said first III-nitride semiconductor body comprises GaN and said second III-nitride semiconductor body comprises AlGaN.

15. The III-nitride device of claim 1, further comprising a substrate, wherein said III-nitride heterojunction is disposed over said substrate.

16. The III-nitride device of claim 15, wherein said substrate comprises one of Si, SiC, and sapphire.

17. The III-nitride device of claim 15, further comprising a transition layer between said substrate and said III-nitride heterojunction.

18. The III-nitride device of claim 17, wherein said transition layer comprises AlN.

* * * * *